(12) United States Patent
Tait et al.

(10) Patent No.: US 10,614,964 B2
(45) Date of Patent: Apr. 7, 2020

(54) MULTI-SOLVENT PEROVSKITE COMPOSITION

(71) Applicants: IMEC VZW, Leuven (BE); Katholieke Universiteit Leuven, KU LEUVEN R&D, Leuven (BE)

(72) Inventors: Jeffrey Gerhart Tait, Leuven (BE); Kira Gardner, Leuven (BE); Robert Gehlhaar, Herent (BE); Weiming Qiu, Leuven (BE); Tamara Merckx, Bertem (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 16/069,032

(22) PCT Filed: Jan. 17, 2017

(86) PCT No.: PCT/EP2017/050861
§ 371 (c)(1),
(2) Date: Jul. 10, 2018

(87) PCT Pub. No.: WO2017/129441
PCT Pub. Date: Aug. 3, 2017

(65) Prior Publication Data
US 2018/0358184 A1    Dec. 13, 2018

(30) Foreign Application Priority Data

Jan. 29, 2016 (EP) ...................... 16153479

(51) Int. Cl.
| | |
|---|---|
| *C30B 29/00* | (2006.01) |
| *H01L 29/00* | (2006.01) |
| *H01L 51/00* | (2006.01) |
| *H01G 9/20* | (2006.01) |
| *C23C 18/12* | (2006.01) |
| *C07F 7/24* | (2006.01) |
| *C09D 5/24* | (2006.01) |
| *H01G 9/00* | (2006.01) |
| *H01L 51/42* | (2006.01) |

(52) U.S. Cl.
CPC .............. *H01G 9/2009* (2013.01); *C07F 7/24* (2013.01); *C09D 5/24* (2013.01); *C23C 18/1216* (2013.01); *H01G 9/0036* (2013.01); *H01L 51/006* (2013.01); *H01L 51/0007* (2013.01); *H01L 51/0028* (2013.01); *H01L 51/0077* (2013.01); *H01L 51/4253* (2013.01); *H01L 51/0056* (2013.01); *H01L 51/4226* (2013.01)

(58) Field of Classification Search
CPC .............. H01L 51/0003; H01L 51/424; H01L 51/4206; H01L 51/0007; H01L 51/4213; C30B 29/12
See application file for complete search history.

(56) References Cited

U.S. PATENT DOCUMENTS

| 5,527,567 | A | 6/1996 | Desu et al. | |
|---|---|---|---|---|
| 2015/0228415 | A1* | 8/2015 | Seok ................... | H01G 9/2031 136/256 |
| 2015/0349282 | A1* | 12/2015 | Seok ................... | H01G 9/2031 438/82 |
| 2016/0005547 | A1* | 1/2016 | Seok ................... | H01L 51/4226 136/255 |
| 2018/0248052 | A1* | 8/2018 | Seok ................... | H01L 51/0003 |

FOREIGN PATENT DOCUMENTS

| EP | 2520692 A2 | 11/2012 |
|---|---|---|
| EP | 2897178 A2 | 7/2016 |
| WO | WO 2013/171517 | 11/2013 |

* cited by examiner

*Primary Examiner* — Haidung D Nguyen
(74) *Attorney, Agent, or Firm* — Knobbe, Martens, Olson & Bear, LLP

(57) ABSTRACT

The present invention relates to a composition comprising one or more perovskite precursors dissolved in a mixture of solvents comprising:
  i. one or more polar aprotic solvents, each selected in such a way that it can, when used in absence of other components, dissolve said one or more perovskite precursors,
  ii. one or more linear alcohols of general formula $C_nH_{2n+1}OH$, wherein n is from 1 to 12, and
  iii. optionally, one or more acids
wherein the polar aprotic solvent or mixture of polar aprotic solvents represent between 50 and 95 vol % of the mixture of solvents, wherein the vol % of the mixture of solvents not occupied by polar aprotic solvents is occupied for at least 90 vol %, preferably for 100 vol %, by the one or more linear alcohols, and the one or more acids if present.

22 Claims, 4 Drawing Sheets

MULTI-SOLVENT PEROVSKITE COMPOSITION

INCORPORATION BY REFERENCE TO RELATED APPLICATIONS

Any and all priority claims identified in the Application Data Sheet, or any correction thereto, are hereby incorporated by reference under 37 CFR 1.57. This application is the national phase under 35 U.S.C. § 371 of prior PCT International Application No. PCT/EP2017/050861 which has an International Filing Date of Jan. 17, 2017, which designates the United States of America, and which claims priority to European Application No. EP 16153479.7 filed Jan. 29, 2016. Each of the aforementioned applications is incorporated by reference herein in its entirety, and each is hereby expressly made a part of this specification.

TECHNICAL FIELD OF THE INVENTION

The present invention relates to compositions used for the formation of perovskites.

BACKGROUND OF THE INVENTION

Halide perovskites have rapidly become a front runner in the area of cost-effective semiconducting materials for thin film photovoltaics, attaining certified 20.1% efficiency for single junction devices. These halide perovskites typically have a general chemical formula of $AMX_3$, where A represents a cation, M a metal ion and X either a single halide or a mixture of halides. For photovoltaic applications, the cation is typically an organic cation but may in some cases also be an inorganic cation. Examples include the single halide methylammonium lead triiodide ($CH_3NH_3PbI_3$) and its mixed halide variant $CH_3NH_3PbI_{3-x}Cl_x$, as well as the all inorganic $CsSnI_3$. These semiconductors display many interesting characteristics, such as being solution-processable, having a controllable and direct band gap, and being relatively tolerant to defects. Solution deposition in either one or two steps has led to devices showing high performance and presents a viable option for large scale manufacturing in the commercial market. Beyond photovoltaics applications, many other uses employing a variety of perovskite materials are known; examples include spintronic applications, light emitting diodes and lasers.

Single-step deposition of perovskite is the most promising cost-effective process available. The process however hinges on several aspects such as suspending the precursors in a solvent, coating the substrate quickly and uniformly, drying into a morphologically optimal film, and supporting perovskite formation. Control of fabrication processes and parameters remain therefore a challenge in the formation of the crystalline structure of a characteristic perovskite.

The majority of common solvents implemented in the art for deposition of perovskites are hazardous to handle, using toxic N,N-dimethylformamide (DMF) and dimethylacetamide (DMA), skin penetrating dimethyl sulfoxide (DMSO), or carcinogenic N-methyl-2-pyrrolidone (NMP). It is however important to account for occupational safety for operators in manufacturing and scientists in the lab, who may come into direct contact with or inhale the fumes of the solvents.

There is thus still a need within the art for good compositions for the fabrication of perovskites, which have low toxicity while retaining a high performance of the resulting devices.

SUMMARY OF THE INVENTION

It is an object of the present invention to provide good compositions and methods for the fabrication of perovskites.

It is an advantage of embodiments of the present invention that the solvent systems used in these compositions may present a low hazard.

It is an advantage of embodiments of the present invention that the solvent systems used in these compositions may be relatively inexpensive.

It is an advantage of embodiments relating to the perovskites made from these compositions that they may display the same, or similar, device characteristics as those made from more toxic and/or more expensive compositions.

It is an advantage of compositions according to embodiments of the present invention that they can be applied on substrates by linear deposition techniques, such as blade coating.

The above objective is accomplished by compositions and methods in accordance with the present invention.

In a first aspect, the present invention relates to a composition comprising one or more perovskite precursors dissolved in a mixture of solvents comprising:
  i. one or more polar aprotic solvents, each selected in such a way that it can, when used in absence of other components, dissolve said one or more perovskite precursors,
  ii. one or more linear alcohols of general formula $C_nH_{2n+1}OH$, wherein n is from 1 to 12, and
  iii. optionally, one or more acids
wherein the polar aprotic solvent or mixture of polar aprotic solvents represent between 50 and 95 vol % of the mixture of solvents.

In a second aspect, the present invention relates to a kit of parts comprising:
  a) one or more perovskite precursors present in pure form, as a mixture thereof, or as a combination of one or more precursors in pure form and one or more mixtures of perovskites, and
  b) a plurality of solvents present in pure form, as a mixture thereof, or as a combination of one or more solvents in pure form and one or more mixtures of solvents, comprising:
      i. one or more polar aprotic solvents, each selected in such a way that it can, when used in absence of other components, dissolve said one or more perovskite precursors,
      ii. one or more linear alcohols of general formula $C_nH_{2n+1}OH$, wherein n is from 1 to 12, and
      iii. optionally, one or more acids.

In a third aspect, the present invention relates to a method for forming a composition according to the first aspect, comprising dissolving the one or more perovskite precursors in the mixture of solvents.

In a fourth aspect, the present invention relates to a process for forming a perovskite film on a substrate, comprising:
  a. applying a composition according to the first aspect on the substrate, and
  b. heating the substrate, thereby forming a crystalline perovskite film on the substrate.

In a fifth aspect, the present invention relates to a composite substrate comprising a perovskite film obtainable by the process according to the fourth aspect.

In a sixth aspect, the present invention relates to a semiconducting device comprising a composite substrate according to the fifth aspect.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

Figure 1:
FIG. 1 is a representation of a photovoltaic cell in accordance with embodiments of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein and unless provided otherwise, the term "polar aprotic solvent" relates to a solvent with a polarity of at least 1.65 D, a dielectric constant of at least 15, and that is not able to act as a proton donor (i.e. it lacks an acidic hydrogen and it does not have hydrogen atoms labile enough to form hydrogen bonds). Preferably, the polar aprotic solvents used in the present invention have a polarity of at least 3.00 Debye. Preferably, the polar aprotic solvents used in the present invention have a dielectric constant of at least 30.

In a first aspect, the present invention relates to a composition comprising one or more perovskite precursors dissolved in a mixture of solvents comprising:
  i. one or more polar aprotic solvents, each selected in such a way that it can, when used in absence of other components, dissolve said one or more perovskite precursors,
  ii. one or more linear alcohols of general formula $C_nH_{2n+1}OH$, wherein n is from 1 to 12, and
  iii. optionally, one or more acids
  wherein the polar aprotic solvent or mixture of polar aprotic solvents represent between 50 and 95 vol % of the mixture of solvents.

Up to now, compositions used to fabricate perovskites are commonly based on pure polar aprotic solvents, typically dimethylformamide (DMF). However, DMF is a toxic solvent which makes it hazardous to use for operators and scientists. Other, less hazardous, polar aprotic solvents are known, such as γ-butyrolactone (GBL); additionally these other solvents may be cheaper than DMF. However, using pure GBL as a solvent results in a decreased perovskite film quality: the obtained film has a low coverage and large pinholes are present, in turn resulting in a markedly lower device performance.

Surprisingly, it was found within the present invention that using a mixture of solvents according to the first aspect addresses these issues. The advantage is twofold: on the one hand, by replacing an amount of polar aprotic solvent by alcohol and, optionally, acid, less of the toxic and expensive polar aprotic solvent, such as DMF, is needed. Alcohols and acids can be less toxic and less expensive than polar aprotic solvents. On the other hand, using an amount of alcohol and, optionally, acid, in addition to the polar aprotic solvent(s) provides films of a quality comparable to the films obtained with pure DMF as a solvent and of improved quality when compared to films obtained when using other, less toxic and/or less expensive, polar aprotic solvents, such as GBL.

Preferably, the acid may be an organic acid.

In embodiments, the vol % of the mixture of solvents not occupied by the polar aprotic solvents may be occupied for at least 90%, preferably for 100% by the one or more linear alcohols, and the one or more acids if present.

The alcohol, and acid if present, are advantageously used as co-solvents, thereby replacing an amount of polar aprotic solvent.

In embodiments, the polar aprotic solvent may be γ-butyrolactone (GBL).

GBL is advantageously cheaper and less toxic than the commonly used DMF. Used in conjunction with the alcohol and acid (if present), a similar perovskite film quality, and similar resulting device characteristics as with pure DMF can advantageously be obtained.

In other embodiments, the polar aprotic solvent may be propylene carbonate (PC), dimethyl sulfoxide (DMSO), dimethylformamide (DMF), dimethylacetamide (DMA) or N-methyl-2-pyrrolidone (NMP).

In embodiments, the one or more linear alcohols may represent at least 5 vol % of the mixture and the one or more acids, if present, may represent at least 5 vol % of the mixture. In preferred embodiments, the one or more linear alcohols may represent at least 15 vol % of the mixture and the one or more acids, if present, may represent at least 15 vol % of the mixture. The one or more alcohols and the one or more acids may for example each represent 20 vol % of the mixture.

In embodiments, the polar aprotic solvent or mixture of polar aprotic solvents may represent from 50 to 85 vol % of the mixture and the one or more linear alcohols and the one or more acids (if present), may represent 15 vol % or more of the mixture of solvents. In preferred embodiments, the polar aprotic solvent or mixture of polar aprotic solvents may represent from 50 to 70 vol % of the mixture and the one or more linear alcohol and the one or more acids (if present) may together represent 30 vol % or more of the mixture. The alcohols and acids (if present) may for example represent 40 vol % of the mixture.

Replacing more than 15 vol % of the polar aprotic solvent by the alcohol(s) and acid(s), if present, advantageously allows the benefits, i.e. reduced toxicity and/or reduced cost, of the replacement to have a considerable effect. These benefits are advantageously achieved while maintaining, or even improving, the formation of a film with few pinholes and good resulting device characteristics. While higher percentages of alcohol and optionally acid typically lead to an increased beneficial effect, for vol % in excess of 50 vol % for the combination the one or more alcohols and optional one or more acids, competition typically starts to occur with the ability of the mixture of solvent to dissolve the one or more perovskite precursors and to form a high quality perovskite film from them.

The best results have been obtained when:
the polar aprotic solvent(s) represents from 50 to 70 vol %, preferably from 55 to 65 vol % of the composition,
the alcohol(s) represents from 10 to 30 vol % of the composition, preferably from 15 to 25 vol % of the composition, and
the acid(s) represents from 10 to 30 vol % of the composition, preferably from 15 to 25 vol % of the composition, and the sum of the vol % of the polar aprotic solvent(s), the alcohol (s) and the acid(s) amounts to at least 90% and preferably to 100%.

Particularly advantageous were composition wherein:
the polar aprotic solvent is GBL and represents from 50 to 70 vol %, preferably from 55 to 65 vol % of the composition,
the alcohol(s) represents from 10 to 30 vol % of the composition, preferably from 15 to 25 vol % of the composition, and
the acid(s) represents from 10 to 30 vol % of the composition, preferably from 15 to 25 vol % of the composition, and the sum of the vol % of the polar aprotic solvent(s), the alcohol (s) and the acid(s) amounts to at least 90% and preferably to 100%.

Even more advantageous were composition wherein:
the polar aprotic solvent is GBL and represents from 50 to 70 vol %, preferably from 55 to 65 vol % of the composition,
the alcohol is ethanol or n-propanol and represents from 10 to 30 vol % of the composition, preferably from 15 to 25 vol % of the composition, and
the acid(s) represents from 10 to 30 vol % of the composition, preferably from 15 to 25 vol % of the composition, and the sum of the vol % of the polar aprotic solvent(s), the alcohol (s) and the acid(s) amounts to at least 90% and preferably to 100%.

Yet even more advantageous were composition wherein:
the polar aprotic solvent is GBL and represents from 50 to 70 vol %, preferably from 55 to 65 vol % of the composition, the alcohol is ethanol or n-propanol and represents from 10 to 30 vol % of the composition, preferably from 15 to 25 vol % of the composition, and the acid is acetic acid and represents from 10 to 30 vol % of the composition, preferably from 15 to 25 vol % of the composition, and the sum of the vol % of the polar aprotic solvent(s), the alcohol (s) and the acid(s) amounts to at least 90% and preferably to 100%.

In embodiments, the one or more perovskite precursors may comprise:
i. a compound with general chemical formula $A^+X^-$,
ii. and/or either a compound of general chemical formula $M^{2+}X'^-_2$ or a compound of general chemical formula $M^{3+}X'^-_3$;
wherein $A^+$ is a monovalent amine cation (such as e.g. methylammonium, formamidinium, phenethylammonium) or is $Cs^+$,
$M^{2+}$ is $Pb^{2+}$, $Sn^{2+}$, $Ge^{2+}$ or $Cu^{2+}$,
$M^{3+}$ is $Bi^{3+}$, $Au^{3+}$ or $In^{3+}$,
$X^-$ and $X'^-$ are independently selected from $I^-$, $Br^-$, $Cl^-$, nitrate, and acetate.

The composition comprises one or more perovskite precursors which typically comprise at least one compound of general formula $A^+X^-$, $M^{2+}X'^-_2$, or $M^{3+}X'^-_3$. For example it may comprise both a compound of general formula $A^+X^-$ and one of general formula $M^{2+}X'^-_2$. In other examples it may also comprise a compound of general formula $A^+X^-$ and two compounds of general formula $M^{2+}X'^-_2$. The molar ratio of the compounds of general formula $A^+X^-$ to the ones of general formula $M^{2+}X'^-_2$, if both types of compounds are present, is typically from 1 to 5, it may for example be 3. In yet other examples, one or more compounds of general chemical formula $M^{3+}X'^-_3$ may replace the one or more compounds of general chemical formula $M^{2+}X'^-_2$. $A^+$ may either be a monovalent amine cation, such as methylammonium, formamidinium, ethylammonium, acetamidinium, 1,4-benzene diammonium, benzylammonium, iso-butylammonium, n-butylammonium, t-butylammonium, diethylammonium, dimethylammonium, ethane 1,2-diammonium, ethylammonium, guanidinium, imidazolium, phenylammonium, propane 1, 3 diammonium, or iso-propylammonium, or a monovalent inorganic cation, such as $Cs^+$. $M^{2+}$ is typically a divalent cation such as $Pb^{2+}$, $Sn^{2+}$ $Ge^{2+}$ or $Cu^{2+}$. $M^{3+}$ may be a trivalent cation such as $Bi^{3+}$, $Au^{3+}$ or $In^{3+}$. $X^-$ and $X'^-$ are typically monovalent anions, such as $I^-$, $Br^-$ and $Cl^-$, nitrate ($NO_3^-$) and acetate ($Ac^-$). The use of an acetate typically leads to the formation more volatile by-products upon formation of the perovskite, as compared to the by-products formed from $I^-$, $Br^-$ and $Cl^-$. These more volatile by-products are advantageously more easily removed in the annealing phase. In any case however, at least one source of $I^-$, $Br^-$ or $Cl^-$ must be present during the formation of the perovskite. The composition according to the present invention however does not necessarily need to comprise such source of $I^-$, $Br^-$ or $Cl^-$ since it could be used in a two steps process in combination with another composition, according to the present invention or not, comprising such a source.

For example, the composition of the present invention can, in some embodiments, comprise both a compound with general chemical formula $A^+X^-$ and a compound of general chemical formula $M^{2+}X'^-_2$ or $M^{3+}X'^-_3$ wherein at least one of $X^-$ and $X'^-$ is independently selected from $I^-$, $Br$, $Cl^-$. For example, $A^+X^-$ and $M^{2+}X'^-_2$ may be both present therein and one of $X^-$ or $X'^-$ is acetate while the other one is $I^-$, $Br$ or $Cl^-$.

In other embodiments, the source $I^-$, $Br$, $Cl^-$ could, e.g. in some two step deposition processes, originates from a second composition, for example where a first composition comprises $A^+X^-$ while a second composition comprises $M^{2+}X'^-_2$ or $M^{3+}X'^-_3$ and one of $X^-$ or $X'^-$ is acetate while the other one is $I^-$, $Br^-$ or $Cl^-$.

Examples of common compounds with general chemical formula $A^+X^-$ include acetamidinium iodide, 1,4-benzene diammonium iodide, benzylammonium bromide, benzylammonium iodide, iso-butylammonium bromide, n-butylammonium bromide, t-butylammonium bromide, iso-butylammonium iodide, n-butylammonium iodide, t-butylammonium iodide diethylammonium bromide, diethylammonium iodide, dimethylammonium bromide, dimethylammonium iodide, ethane 1,2 diammonium bromide, ethane 1,2 diammonium iodide, ethylammonium bromide, ethylammonium iodide formamidinium bromide, formamidinium iodide, guanidinium bromide, guanidinium iodide, imidazolium bromide, imidazolium iodide, methylammonium bromide, methylammonium iodide, phenethylammonium bromide, phenethylammonium iodide, phenylammonium bromide, phenylammonium iodide, propane 1,3 diammonium bromide, propane 1,3 diammonium iodide, iso-propylammonium bromide, n-propylammonium bromide, iso-propylammonium iodide n-propylammonium iodide and cesium iodide. Examples of compounds of general chemical formula $M^{2+}X'^-_2$ include $PbI_2$, $PbCl_2$, $Pb(NO_3)_2$, $PbAc_2$, $PbBr_2$, $SnI_2$, $SnCl_2$, $Sn(NO_3)_2$, $SnAc_2$, $SnBr_2$, $GeI_2$, $GeCl_2$, $Ge(NO_3)_2$, $GeAc_2$, $GeBr_2$, $CuI_2$, $CuCl_2$, $Cu(NO_3)_2$, $CuAc_2$, $CuBr_2$. Examples of compounds of general chemical formula $M^{3+}X'^-_3$ include $BiI_3$, $BiCl_3$ and $BiBr_3$.

In embodiments, n in the general formula $C_nH_{2n+1}OH$ may be from 1 to 6, preferably from 1 to 3 and most preferably from 1 to 4.

For ease of handling, the alcohol is typically a liquid alcohol at room temperature. In any case, the alcohol may be a liquid at the operating temperature, or it may form a liquid mixture with the polar aprotic solvent and acid, if present. In preferred embodiments, the alcohol may be ethanol, 1-propanol or a mixture thereof. Ethanol and 1-propanol advantageously allow good perovskite films to be fabricated, while being less toxic than methanol.

In embodiments, the acid may be an organic acid. Preferably, it is an organic acid of general formula $C_nH_{2n+1}COOH$, wherein n is from 1 to 3 and may most preferably be acetic acid.

In embodiments, the composition may be suitable for application by a linear deposition technique such as for example blade coating.

Blade coating is advantageously an application technique which is suitable for use on an industrial scale.

In embodiments, the composition may be suitable for application by slot die coating or spray coating.

In a second aspect, the present invention relates to a kit of parts comprising:
a. one or more perovskite precursors present in pure form, as a mixture thereof, or as a combination of one or more precursors in pure form and one or more mixtures of perovskites, and
b. a plurality of solvents present in pure form, as a mixture thereof, or as a combination of one or more solvents in pure form and one or more mixtures of solvents, comprising:
 i. one or more polar aprotic solvents, each selected in such a way that it can, when used in absence of other components, dissolve said one or more perovskite precursors,
 ii. one or more linear alcohols of general formula $C_nH_{2n+1}OH$, wherein n is from 1 to 12, and
 iii. optionally, one or more acids.

The composition according to the first aspect may advantageously take the form of a kit of parts, comprising separately the perovskite precursors and the plurality of solvents, each either in pure form, as a mixture or as a combination thereof.

The perovskite precursors, the polar aprotic solvents, the linear alcohols and the acids may be as described in any embodiments of the first aspect.

In a third aspect, the present invention relates to a method for forming a composition according to the first aspect, comprising dissolving the one or more perovskite precursors in the mixture of solvents.

The perovskite precursors and the mixture of solvents may be as described in any embodiments of the first aspect of the present invention.

In embodiments, dissolving the one or more perovskite precursors in the mixture may comprise heating up the mixture to at least 30° C., preferably at least 45° C., most preferably at least 60° C.

Heating the mixture advantageously speeds up the dissolution of the perovskite precursor. The composition is typically stirred during the dissolution.

In other embodiments, dissolving the perovskite precursor may be achieved without heating up the mixture.

In a fourth aspect, the present invention relates to a process for forming a perovskite film on a substrate, comprising:
a. applying a composition according to the first aspect on the substrate, and
b. heating the substrate, thereby forming a crystalline perovskite film on the substrate.

In some embodiments, the precursor compounds may be present in a plurality of compositions and the plurality of compositions are applied on the substrate.

In preferred embodiments, the composition according to the first aspect is a freshly prepared composition.

In embodiments, the substrate may be heated to a temperature of from 75 to 240° C., preferably from 120 to 160° C.

Heating the substrate advantageously allows the solvent and any by-products to be removed and the crystalline perovskite film to be formed.

In a fifth aspect, the present invention relates to a composite substrate comprising a perovskite film obtainable by the process according to the third aspect.

In a sixth aspect, the present invention relates to a semiconducting device comprising a composite substrate according to the fifth aspect.

In embodiments, the semiconducting device may be a photovoltaic cell.

The perovskite film may advantageously be used in a semiconducting device, such as a photovoltaic cell.

The invention will now be described by a detailed description of several embodiments of the invention. It is clear that other embodiments of the invention can be configured according to the knowledge of the person skilled in the art without departing from the true technical teaching of the invention, the invention being limited only by the terms of the appended claims.

Example 1: Making a Photovoltaic Cell Using a Composition in Accordance with the Present Invention We now refer to FIG. 1. A photovoltaic cell is prepared using a composition in accordance with the present invention.

In a first step, a conductive substrate was prepared. Indium doped transparent tin oxide coated glass (ITO) was purchased from Colorado Concepts and cleaned using a 5-minute each ultrasonic bath in detergent, deionized water, acetone, and finally isopropyl alcohol. Next, 20 nm of $TiO_2$ was deposited by electron beam deposition in vacuum at a pressure of $<2.0 \times 10^{-7}$ Pa onto the ITO.

In a second step, the perovskite precursor composition was prepared. In a 3.0 mL glass vial, containing a small stir bar, 237 mg of methylammonium iodide (MAI), 151.5 mg of lead acetate ($Pb(OAc)_2$) and 26.6 mg of lead chloride ($PbCl_2$) was added. The dry mixture of initially white powder turned slightly yellow when MAI and $Pb(OAc)_2$ make contact. The addition of $PbCl_2$ caused some of the mixture to turn slightly grey. This was done in ambient conditions immediately after weighing out the desired amount of material. The final molar ratio of the optimal coating materials was 0.2:0.8:3.0 for $PbCl_2$:$Pb(OAc)_2$:MAI. A final desired molarity of the solution (0.9 M) was obtained by bringing the dry mixture-containing vial into a $N_2$ filled glovebox and adding the desired solvent to dissolve the precursors.

The desired solvent was in this case a mixture of γ-butyrolactone (GBL), ethanol (EtOH) and acetic acid (AcOH) in 60/20/20 vol % ratio, respectively. This mixture had a final total volume of 0.55 mL. This was obtained by adding 330 μL of GBL, which immediately formed a yellow solution and dissolved most of the precursor, though leaving some undissolved powder at the bottom of the vial. Next 110 μL of EtOH was added, the appearance of the solution remaining the same, and finally 100 μL of AcOH was added, the appearance of the solution again remaining unchanged from the initial GBL addition; namely as a mostly clear yellow liquid with slightly undissolved precursor powder at the bottom. The vial was then placed on a heated stir plate at 50° C. and was heated and stirred for 60 minutes or until all precursor dissolved.

In a third step, the perovskite film is formed on the substrate. To that end, a room temperature composition according to the second step was added dropwise with a glass pipet to the $TiO_2$-coated substrate in a $N_2$ atmosphere glove box. The substrate was then spin coated at 2000 rpm with 5000 rpm/s acceleration for 60 s. Immediately after removal, the coating was clear, light yellow, smooth and still wet. The coated substrate was set aside, still in glove box, for ~10 minutes to allow the formation of an intermediate state before annealing. This intermediate state could be distinguished in the drying and light brown coloration of the layer. In the same glove box, the substrate was then immediately placed on a hot plate at 140° C. for 10 minutes. The substrate was subsequently removed and placed in a holder, while still remaining in the glove box.

In a fourth step, a hole transporting material was deposited on top of the perovskite layer. The organic hole transporting Spiro-OMeTAD was first prepared in a glovebox with $N_2$ atmosphere at room temperature: 80 mg of 2,2',7,7'-tertrakis(N,N-di-p-methoxyphenylamine)-9,9'-spirobifluorene was dissolved in 1 mL chlorobenzene, then 28.5 μL 4-tert-butyl-pyridine and 17.5 μL of 520 mg lithium-bis(trifluoromethanesulfonyl) imide (Li-TFSI) in 1 mL of acetonitrile was added to this solution. This solution was deposited dropwise onto the perovskite coated substrate and spin-coated at 1000 rpm with 5000 rpm/s acceleration for 60 s in the glove box. The coated substrate was then placed in ambient air for 24 hours before electrode deposition.

In a final step, a 80 nm thick gold electrode was deposited on top of the coated substrate by thermal evaporation in vacuum at a pressure of <2.0×10$^{-4}$ Pa

Example 2: Comparison Between Photovoltaic Cells Made Using Different Solvent Mixtures Example 1 was repeated using different desired solvents in step 2, including pure GBL and DMF, as well as GBL in combination with EtOH, PrOH (1-propanol) and/or AcOH.

The resulting device characteristics, namely the open circuit voltage Voc, the short cut current ($J_{SC}$), the fill factor (FF) the initial efficiency ($\eta_{initial}$) and the efficiency after five minutes of maximum power point tracking under constant AM1.5G illumination ($\eta_{MPP}$), are listed in the following table.

Figure 2:
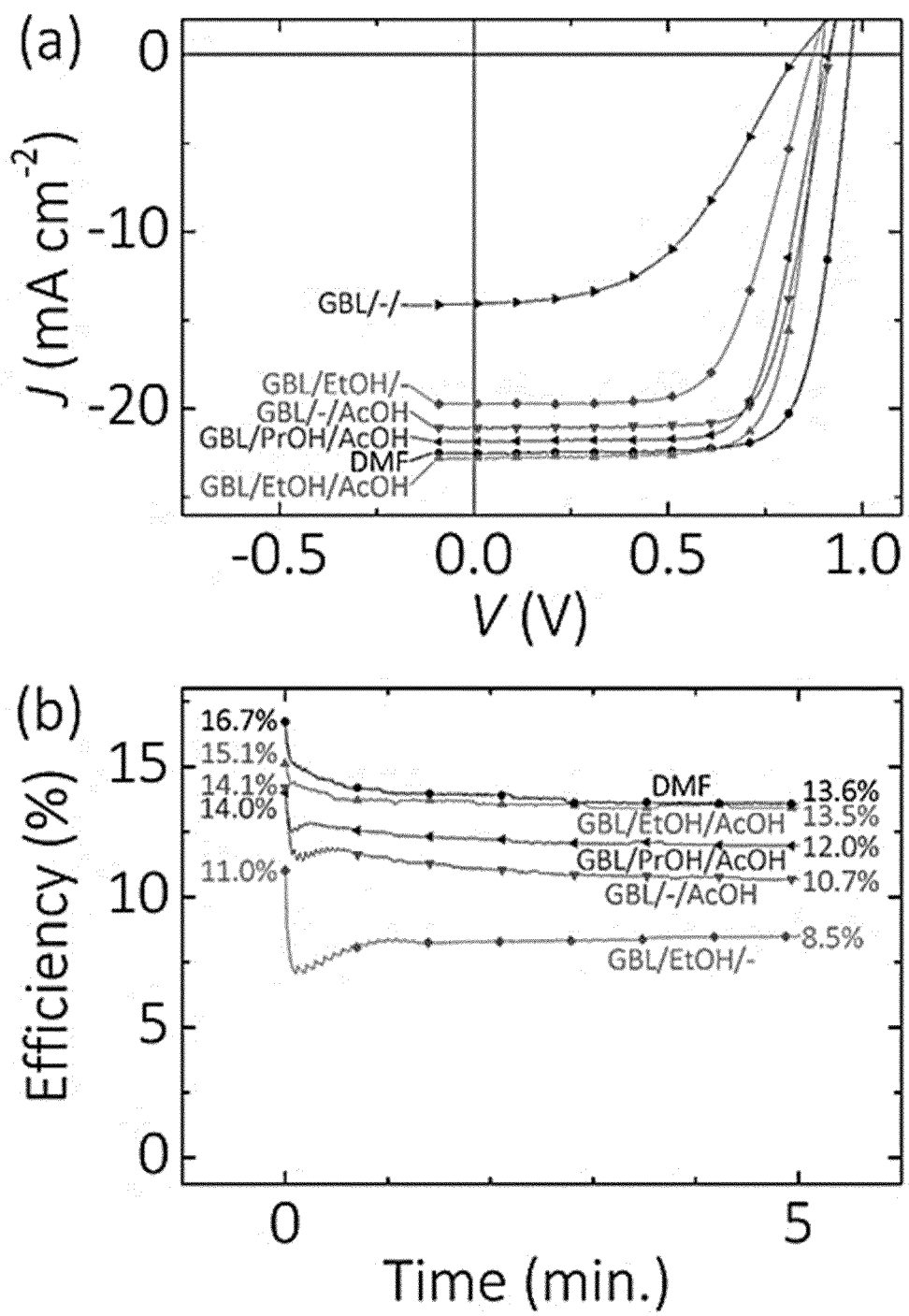
FIG. 2 shows the current/voltage curves (a) and the evolution of the efficiency over time (b) of photovoltaic cells made according to an example of the present invention.

We now refer to FIG. 2. The current/voltage curves (FIG. 2a) and the evolution of the efficiency over time (FIG. 2b) of photovoltaic cells made from the above solvent mixtures are shown.

Example 3: Comparison of Different Solvent Systems

Example 1 was repeated up to step 4, using different desired solvents in step 2. Different combinations using GBL, AcOH, EtOH, PrOH, IPA (isopropanol), PC (propylene carbonate), and DMEA (dimethylethanolamine) are considered. The ability of the different solvent systems to dissolve the perovskite precursors and to form a perovskite film from the resulting composition is evaluated in the table below. Observations about the appearance of the resulting composition are also included.

| Solvent System | Volume (%) | Final Mol | Miscible? | Perovskite? | Observations |
|---|---|---|---|---|---|
| GBL | 100 | 1M | Y | Y | clear yellow |
| GBL/PC/EtOH | 33/33/33 | 1M | Y | N | clear yellow |
| GBL/EtOH/AcOH | 60/20/20 | 1M | Y | Y | clear yellow |
| GBL/EtOH/AcOH | 80/10/10 | 1M | Y | Y | clear yellow |
| GBL/EtOH/AcOH | 40/30/30 | 1M | N | — | black precipitate + yellow clear |
| GBL/EtOH/AcOH | 20/40/40 | 1M | N | — | black precipitate, sludgy |
| GBL/PrOH/AcOH | 60/20/20 | 1M | Y | Y | clear yellow, precipitates w/50° C. |
| GBL/PrOH/AcOH | 80/10/10 | .7M | Y | Y | clear yellow, precipitates w/50° C. |
| GBL/PrOH/AcOH | 40/30/30 | .7M | N | — | black precipitate |
| GBL/PrOH/AcOH | 20/40/40 | .7M | N | — | black precipitate, sludgy |
| GBL/EtOH/— | 70/30/— | 1M | Y | Y | clear yellow |
| GBL/PrOH/— | 70/30/— | 1M | Y | Y | clear yellow |
| GBL/DMEA/— | 60/40/— | 1M | Y | N | clear yellow |
| GBL/IPA/— | 70/30/— | 1M | Y | N | clear yellow |
| GBL/PC/— | 50/50/— | 1M | Y | N | clear yellow |
| DMEA | 100 | 1M | N | — | milky, white, opaque |
| TEG | 100 | 1M | Y | N | clear yellow, viscous |
| DEG | 100 | 1M | Y | N | clear yellow, viscous |

| Solvent mixture | Volume (%) | $V_{OC}$ (V) | $J_{SC}$ (mA cm$^{-2}$) | FF (%) | $\eta_{initial}$ (%) | $\eta_{MPP}$ (%) |
|---|---|---|---|---|---|---|
| GBL/—/— | 100/0/0 | 0.83 | 16.6 | 59 | 9.0 | 3.0 |
| GBL/EtOH/— | 60/40/0 | 0.88 | 18.8 | 62 | 11.0 | 8.5 |
| GBL/EtOH/AcOH | 60/20/20 | 0.88 | 21.2 | 71 | 15.1 | 13.5 |
| GBL/PrOH/AcOH | 60/20/20 | 0.90 | 17.2 | 72 | 14.0 | 12.0 |
| DMF | 100 | 0.96 | 21.9 | 74 | 16.7 | 13.6 |

As can be seen from the table, the use of pure GBL results in a poor device performance. Conversely, by replacing some of the GBL by an alcohol or by the combination of an alcohol and an organic acid, the resulting device performance can be drastically increased. For the case of GBL/EtOH/AcOH, a similar efficiency $\eta_{MPP}$ is obtained as for pure DMF: 13.5% vs 13.6%

The column "Miscible?" indicates whether the perovskite precursors where miscible in the solvent system at the given concentration (Y=miscible, N=not miscible). The column "Perovskite?" indicates whether a perovskite film could be obtained from the composition.

The order in which the different compounds of the solvent mixtures are added to the dry precursor mixtures does not affect the final composition.

Pure DMEA was found inadequate to allow perovskite formation. The same held true for mixtures of DMEA and GBL. Also, mixture of GBL and isopropanol did not permit to from perovskites. All of the glycol solvents did dissolve the precursors but the solutions were extremely viscous and generally darker yellow than the non-glycol solvent systems; the viscosity prevented the proper formation of the perovskite. It appears therefore that the alcohol used together with the polar aprotic solvent is preferably linear and of general formula $C_nH_{2n+1}OH$.

PC used pure or with a >50% solution volume resulted in a cloudy and slightly yellow solution that does not ever dissolve clearly; PC, when used in combination with GBL, also inhibits perovskite formation. It appears therefore that polar aprotic solvents which, when used in absence of other components, cannot dissolve the one or more perovskite precursors, do not lead to the formation of perovskites.

Figure 3:
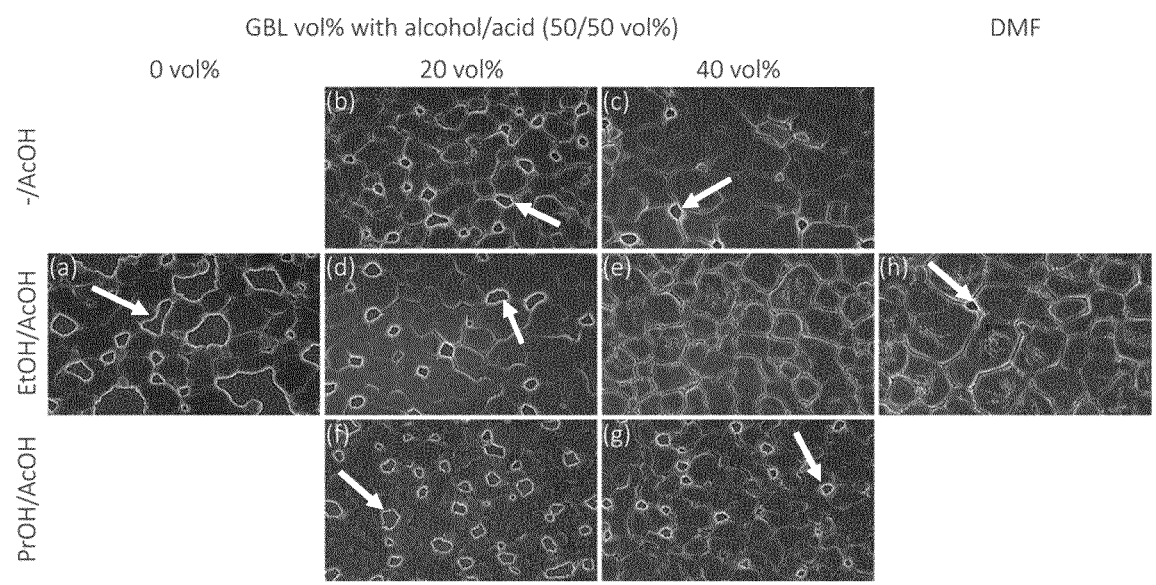
FIG. 3 shows SEM images of perovskite layers fabricated from different solvent mixtures according to the present invention and compared to the prior art.

We now refer to FIG. 3. SEM images of perovskite layers fabricated from different solvent mixtures are shown; the arrows point towards a pinhole. The indicated vol %'s (0, 20, 40) refer to the combined vol %'s of alcohol and acid; if both are present, the alcohol and acid each represent 50 vol % thereof. As can be seen from the amount of pinholes, the layer quality, compared to that obtained from pure GBL (FIG. 3a), is drastically improved in the layers obtained from GBL/EtOH/AcOH and GBL/PrOH/AcOH, according to the present invention. In the case of GBL/EtOH/AcOH 60%/20%/20% (FIG. 3e) the amount of pinholes is even lower than obtained from pure DMF (FIG. 3h).

Figure 4:
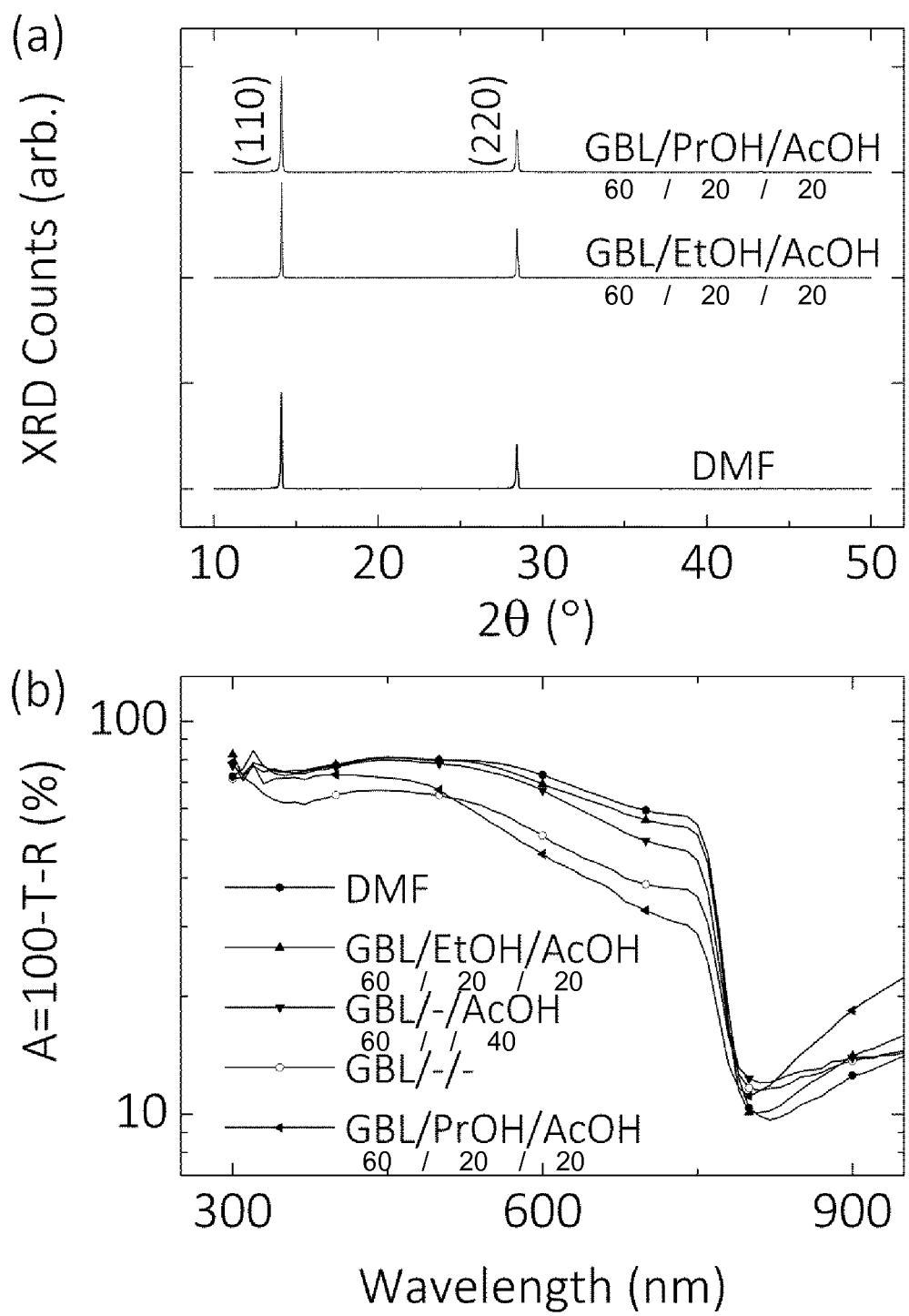
FIG. 4 shows X-ray diffraction (FIG. 4a) and absorption (FIG. 4b) spectra of perovskite layers fabricated from different solvent mixtures according to the present invention and compared to the prior art.

We now refer to FIG. 4. X-ray diffraction (FIG. 4a) and absorption (FIG. 4b) spectra of perovskite layers fabricated from different solvent mixtures are shown. As can be seen from the X-ray diffraction spectra, the layers obtained from mixtures according to the present invention are similar to those obtained from pure DMF. Furthermore, also the absorption spectra are similar in shape; with again the layer obtained from GBL/EtOH/AcOH 60%/20%/20% most closely approximating the case of pure DMF.

Example 4: Comparison of Different Solvent Systems, for Different Perovskite Precursors Example 1 was repeated up to step 4, using different desired solvents in step 2. Furthermore, no PbCl$_2$ was used, so that Pb(oAc)$_2$ is the only lead perovskite precursor. Different combinations using GBL, AcOH, EtOH, PrOH, PC, DMEA, TEG (triethylene glycol), DEG (diethylene glycol), TEA (triethanolamine) and EGBE (ethylene glycol butyl ether) were considered. The ability of the different solvent systems to dissolve the perovskite precursors and to form a perovskite film from the resulting composition are again evaluated in the table below. Observations about the appearance of the resulting composition are again included.

It is to be understood that although preferred embodiments, specific constructions and configurations, as well as materials, have been discussed herein for devices according to the present invention, various changes or modifications in form and detail may be made without departing from the scope and technical teachings of this invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A composition comprising:
   one or more perovskite precursors dissolved in a mixture of solvents, the mixture of solvents comprising:
      one or more polar aprotic solvents, wherein of the one or more polar aprotic solvents is selected such that, when used in an absence of other components, the one or more polar aprotic solvents is capable of dissolving the one or more perovskite precursors;
      one or more linear alcohols of a general formula C$_n$H$_{2n+1}$OH, wherein n is from 1 to 12; and
      one or more acids,
   wherein the one or more polar aprotic solvents represents between 50 and 95 vol % of the mixture of solvents, and
   wherein a vol % of the mixture of solvents not occupied by the one or more polar aprotic solvents is occupied by at least 90 vol % of the one or more linear alcohols and the one or more acids.

2. The composition of claim 1, wherein a vol % of the mixture of solvents not occupied by the one or more polar aprotic solvents is occupied by 100 vol % of the one or more linear alcohols and the one or more acids.

3. The composition of claim 1, wherein the one or more polar aprotic solvents of comprises γ-butyrolactone.

4. The composition of claim 1, wherein the one or more polar aprotic solvents represents from 50 to 90 vol % of the mixture of solvents, wherein the one or more linear alcohols represents at least 5 vol % of the mixture of solvents, and wherein the one or more acids represents at least 5 vol % of the mixture of solvents.

| Solvent System | Volume (%) | Final Mol | Miscible? | Perovskite? | Observations |
|---|---|---|---|---|---|
| GBL | 100 | 1M | Y | Y | clear yellow |
| GBL/PC/— | 70/30/— | 1M | Y | N | clear yellow |
| GBL/PC/EtOH | 33/33/33 | 1M | Y | N | clear yellow |
| GBL/PC/PrOH | 33/33/33 | 1M | Y | N | clear yellow |
| GBL/EtOH/AcOH | 60/20/20 | 1M | Y | Y | clear yellow |
| GBL/PrOH/AcOH | 60/20/20 | 1M | Y | Y | clear yellow |
| PC/PrOH/AcOH | 60/20/20 | 1M | N | — | yellow, opaque |
| GBL/DMEA/— | 60/40/— | 1M | Y | N | clear yellow |
| TEG | 100 | 1M | Y | N | clear yellow, viscous |
| DEG | 100 | 1M | Y | N | clear yellow, viscous |
| GBL/TEG | 70/30/— | 1M | Y | N | clear yellow, viscous |
| GBL/DEG | 70/30/— | 1M | Y | N | clear yellow, viscous |
| GBL/TEA | 70/30/— | 1M | N | — | yellow milky/cloudy |
| EGBE | 100 | 1M | N | — | solid yellow clump, some black |
| GBL/EGBE | 60/40/— | 1M | Y | N | golden yellow clear |
| GBL/PrOH/EGBE | 60/20/20 | 1M | Y | N | clear yellow |
| EGBE/PrOH | 60/40/— | 1M | N | — | solid yellow clump |
| EGBE/DMEA | 60/40/— | 1M | N | — | milky white/opaque yellow |

5. The composition of claim 1, wherein the one or more polar aprotic solvents represents from 50 to 85 vol % of the mixture of solvents and wherein the one or more linear alcohols and the one or more acids represent 15 vol % or more of the mixture of solvents.

6. The composition of claim 1, wherein the one or more acids comprises an organic acid.

7. The composition of claim 6, wherein the organic acid is acetic acid.

8. The composition of claim 1, wherein the one or more perovskite precursors comprises:
   a compound of general chemical formula $A^+X^-$; and
   at least one compound selected from the group consisting of a compound of general chemical formula $M^{2+}X'^-_2$ and a compound of general chemical formula $M^{3+}X'^-_3$;
   wherein A is selected from the group consisting of a monovalent amine cation and $Cs^+$,
   wherein $M^{2+}$ is selected from the group consisting of $Pb^{2+}$, $Sn^{2+}$, $Ge^{2+}$, and $Cu^{2+}$,
   wherein $M^{3+}$ is selected from the group consisting of $Bi^{3+}$, $Au^{3+}$, and $In^{3+}$, and
   wherein $X^-$ and $X'^-$ are independently selected from the group consisting of $I^-$, $Br^-$, $Cl^-$, nitrate, and acetate.

9. The composition of claim 1, wherein n is from 1 to 6.

10. The composition of claim 1, wherein n is from 2 to 3.

11. A method for forming a composition, comprising:
   dissolving one or more perovskite precursors in a mixture of solvents, whereby the composition of claim 1 is obtained, wherein the mixture of solvents comprises:
      one or more polar aprotic solvents, wherein of the one or more polar aprotic solvents is selected such that, when used in an absence of other components, is capable of dissolving the one or more perovskite precursors;
      one or more linear alcohols of a general formula $C_nH_{2n+1}OH$, wherein n is from 1 to 12; and
      one or more acids,
   wherein the one or more polar aprotic solvents represents between 50 and 95 vol % of the mixture of solvents, and
   wherein a vol % of the mixture of solvents not occupied by the one or more polar aprotic solvents is occupied by at least 90 vol % of the one or more linear alcohols and the one or more acids if present.

12. A process for forming a perovskite film on a substrate, comprising:
   applying the composition of claim 1 on a substrate; and
   heating the substrate, thereby forming a crystalline perovskite film on the substrate.

13. The composition of claim 1, wherein the one or more linear alcohols are selected from the group consisting of ethanol, 1-propanol, and combinations thereof.

14. The composition of claim 7, wherein the one or more linear alcohols are selected from the group consisting of ethanol, 1-propanol, and combinations thereof.

15. The composition of claim 8, wherein the one or more polar aprotic solvents or comprises γ-butyrolactone, wherein the one or more acids comprises acetic acid, and wherein the one or more linear alcohols are selected from the group consisting of ethanol, 1-propanol, and combinations thereof.

16. The composition of claim 8, wherein at the one or more perovskite precursors are precursors of a perovskite having a general formula $AM^{2+}X_3$.

17. The composition of claim 8, wherein at the one or more perovskite precursors are precursors of a perovskite having a general formula $AM^{3+}X_3$.

18. The composition of claim 8, wherein at the one or more perovskite precursors are precursors of one or more perovskites having a general formula selected from the group consisting of $AM^{2+}X_3$, $AM^{3+}X_3$, and combinations thereof.

19. The process of claim 12, wherein the one or more perovskite precursors comprises:
   a compound of general chemical formula $A^+X^-$; and
   at least one compound selected from the group consisting of a compound of general chemical formula $M^{2+}X'^-_2$ and a compound of general chemical formula $M^{3+}X'^-_3$;
   wherein A is selected from the group consisting of a monovalent amine cation and $Cs^+$,
   wherein $M^{2+}$ is selected from the group consisting of $Pb^{2+}$, $Sn^{2+}$, $Ge^{2+}$, and $Cu^{2+}$,
   wherein $M^{3+}$ is selected from the group consisting of $Bi^{3+}$, $Au^{3+}$, and $In^{3+}$, and
wherein $X^-$ and $X'^-$ are independently selected from the group consisting of $I^-$, $Br^-$, $Cl^-$, nitrate, and acetate, and
wherein the one or more perovskite precursors are precursors of a perovskite having a general formula $AM^{2+}X_3$.

20. The process of claim 12, wherein the one or more perovskite precursors comprises:
   a compound of general chemical formula $A^+X^-$; and
   at least one compound selected from the group consisting of a compound of general chemical formula $M^{2+}X'^-_2$ and a compound of general chemical formula $M^{3+}X'_3$;
   wherein A is selected from the group consisting of a monovalent amine cation and $Cs^+$,
   wherein $M^{2+}$ is selected from the group consisting of $Pb^{2+}$, $Sn^{2+}$, $Ge^{2+}$, and $Cu^{2+}$,
   wherein $M^{3+}$ is selected from the group consisting of $Bi^{3+}$, $Au^{3+}$, and $In^{3+}$, and
wherein $X^-$ and $X'^-$ are independently selected from the group consisting of $I^-$, $Br^-$, $Cl^-$, nitrate, and acetate, and
wherein the one or more perovskite precursors are precursors of a perovskite having a general formula $AM^{3+}X_3$.

21. The process of claim 12, wherein the one or more perovskite precursors comprises:
   a compound of general chemical formula $A^+X^-$; and
   at least one compound selected from the group consisting of a compound of general chemical formula $M^{2+}X'^-_2$ and a compound of general chemical formula $M^{3+}X'_3$;
   wherein A is selected from the group consisting of a monovalent amine cation and $Cs_+$,
   wherein $M^{2+}$ is selected from the group consisting of $Pb^{2+}$, $Sn^{2+}$, $Ge^{2+}$, and $Cu^{2+}$,
   wherein $M^{3+}$ is selected from the group consisting of $Bi^{3+}$, $Au^{3+}$, and $In^{3+}$, and
   wherein $X^-$ and $X'^-$ are independently selected from the group consisting of $I^-$, $Br^-$, $Cl^-$, nitrate, and acetate, and
   wherein the one or more perovskite precursors are precursors of one or more perovskites having a general formula selected from the group consisting of $AM^{2+}X_3$, $AM^{3+}X_3$, and combinations thereof.

22. The composition of claim 1, consisting of the one or more perovskite precursors and the mixture of solvents.

* * * * *

UNITED STATES PATENT AND TRADEMARK OFFICE
CERTIFICATE OF CORRECTION

PATENT NO. : 10,614,964 B2
APPLICATION NO. : 16/069032
DATED : April 7, 2020
INVENTOR(S) : Jeffrey Gerhart Tait et al.

It is certified that error appears in the above-identified patent and that said Letters Patent is hereby corrected as shown below:

In the Specification

Column 7, Line 65, delete "Br," and insert --$Br^-$,--.

In the Claims

Column 14, Line 35, Claim 3, delete "solvents of" and insert --solvents--.

Column 14, Line 35, Claim 3, delete "y-butyrolactone." and insert --γ-butyrolactone.--.

Column 15, Line 57, Claim 15, delete "y-butyrolactone," and insert --γ-butyrolactone,--.

Column 16, Line 46 (approx.), Claim 21, delete "$M^{3+}X'_3$;" and insert --$M3+X'^-_3$;--.

Column 16, Line 48 (approx.), Claim 21, delete "$Cs_+$," and insert --$Cs^+$,--.

Signed and Sealed this
Eighteenth Day of August, 2020

Andrei Iancu
*Director of the United States Patent and Trademark Office*